(12) United States Patent
Lam et al.

(10) Patent No.: US 8,446,725 B2
(45) Date of Patent: May 21, 2013

(54) AIRFLOW CONTROL IN AN ELECTRONIC CHASSIS

(75) Inventors: Kin N. Lam, South Pasadena, CA (US);
Vason Lee, Thousand Oaks, CA (US);
Frank N. Pham, Moorpark, CA (US);
Raymond W. Eng, Arcadia, CA (US);
Nelson Canelo, North Hills, CA (US)

(73) Assignee: Alcatel Lucent, Paris (FR)

( * ) Notice: Subject to any disclaimer, the term of this patent is extended or adjusted under 35 U.S.C. 154(b) by 188 days.

(21) Appl. No.: 12/851,299

(22) Filed: Aug. 5, 2010

(65) Prior Publication Data

US 2012/0033379 A1 Feb. 9, 2012

(51) Int. Cl.
*H05K 7/20* (2006.01)
*H05K 13/00* (2006.01)

(52) U.S. Cl.
USPC .... 361/695; 361/694; 361/679.5; 361/679.51

(58) Field of Classification Search
USPC ................ 361/687, 679.5, 679.51, 679.53, 361/695; 454/184
See application file for complete search history.

(56) References Cited

U.S. PATENT DOCUMENTS

| | | | | |
|---|---|---|---|---|
| 3,874,444 A * | 4/1975 | Perce et al. | | 165/47 |
| 5,339,221 A * | 8/1994 | Conroy-Wass et al. | | 361/796 |
| 5,995,368 A * | 11/1999 | Lee et al. | | 361/695 |
| 6,924,981 B2 * | 8/2005 | Chu et al. | | 361/696 |
| 6,987,673 B1 * | 1/2006 | French et al. | | 361/727 |
| 7,042,720 B1 * | 5/2006 | Konshak et al. | | 361/679.33 |
| 7,139,170 B2 * | 11/2006 | Chikusa et al. | | 361/695 |
| 7,154,748 B2 * | 12/2006 | Yamada | | 361/690 |
| 7,187,547 B1 * | 3/2007 | French et al. | | 361/679.33 |
| 7,215,552 B2 * | 5/2007 | Shipley et al. | | 361/721 |
| 7,259,961 B2 * | 8/2007 | Lucero et al. | | 361/695 |
| 7,262,962 B1 * | 8/2007 | McLeod et al. | | 361/679.48 |
| 7,394,654 B2 * | 7/2008 | Zieman et al. | | 361/695 |
| 7,420,806 B1 * | 9/2008 | Lima et al. | | 361/695 |
| 7,652,891 B2 * | 1/2010 | Lucero et al. | | 361/752 |
| 7,813,121 B2 * | 10/2010 | Bisson et al. | | 361/679.51 |
| 7,957,133 B2 * | 6/2011 | Zieman et al. | | 361/679.51 |
| 7,965,504 B2 * | 6/2011 | Hamlin | | 361/695 |
| 8,139,358 B2 * | 3/2012 | Tambe | | 361/695 |
| 8,199,500 B2 * | 6/2012 | Yamagiwa | | 361/692 |
| 2002/0126449 A1 * | 9/2002 | Casebolt | | 361/687 |
| 2003/0053293 A1 * | 3/2003 | Beitelmal et al. | | 361/687 |
| 2004/0109288 A1 * | 6/2004 | Beitelmal et al. | | 361/687 |
| 2004/0264128 A1 * | 12/2004 | Crippen et al. | | 361/687 |
| 2005/0083651 A1 * | 4/2005 | Smith et al. | | 361/687 |
| 2005/0286222 A1 * | 12/2005 | Lucero et al. | | 361/690 |
| 2006/0176665 A1 * | 8/2006 | Matsushima et al. | | 361/687 |
| 2007/0002536 A1 * | 1/2007 | Hall et al. | | 361/695 |
| 2007/0178822 A1 * | 8/2007 | Lanus et al. | | 454/184 |
| 2007/0274039 A1 * | 11/2007 | Hamlin | | 361/695 |
| 2008/0055846 A1 * | 3/2008 | Clidaras et al. | | 361/687 |
| 2008/0094799 A1 * | 4/2008 | Zieman et al. | | 361/695 |
| 2008/0113604 A1 * | 5/2008 | Tufford et al. | | 454/187 |
| 2008/0180903 A1 * | 7/2008 | Bisson et al. | | 361/687 |
| 2009/0109619 A1 * | 4/2009 | Wise et al. | | 361/695 |

* cited by examiner

*Primary Examiner* — Anatoly Vortman
(74) *Attorney, Agent, or Firm* — Hitt Gaines PC

(57) ABSTRACT

An electronic equipment cabinet includes a chassis and a fan coupled thereto. The fan is configured to move an airstream through the chassis. A plenum is coupled to the chassis and has a first opening in a first side located to receive the airstream, and a second opening in an adjacent second side. An airflow diverter is located within the plenum. The airflow diverter has a surface oriented to redirect the airstream between the first opening and the second opening.

16 Claims, 7 Drawing Sheets

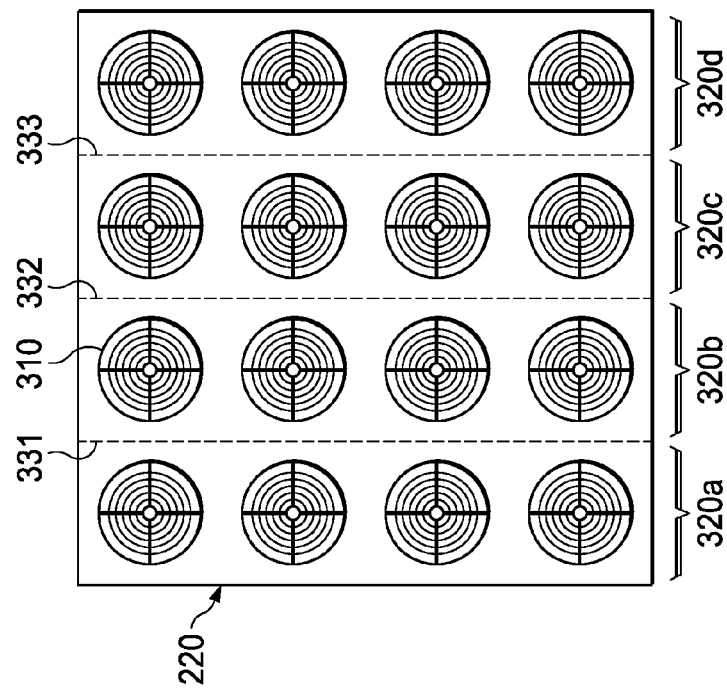
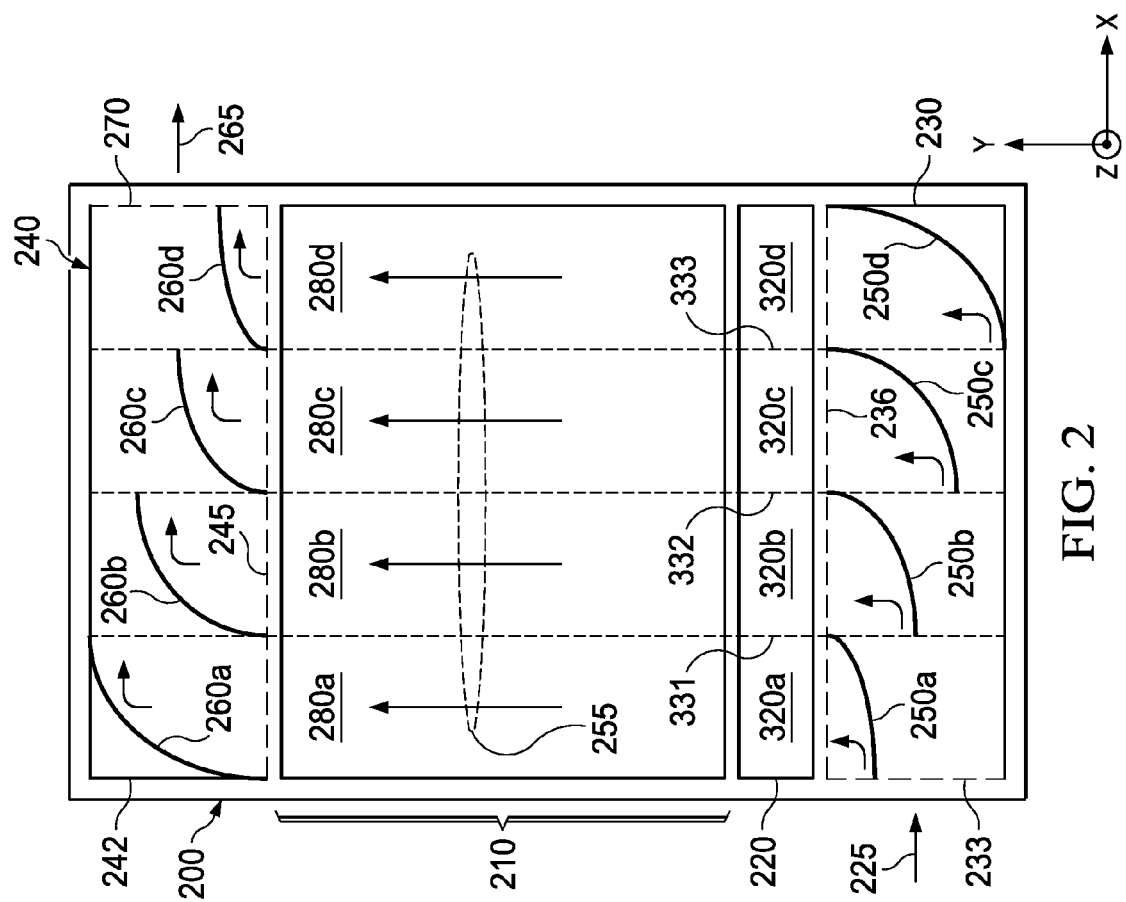

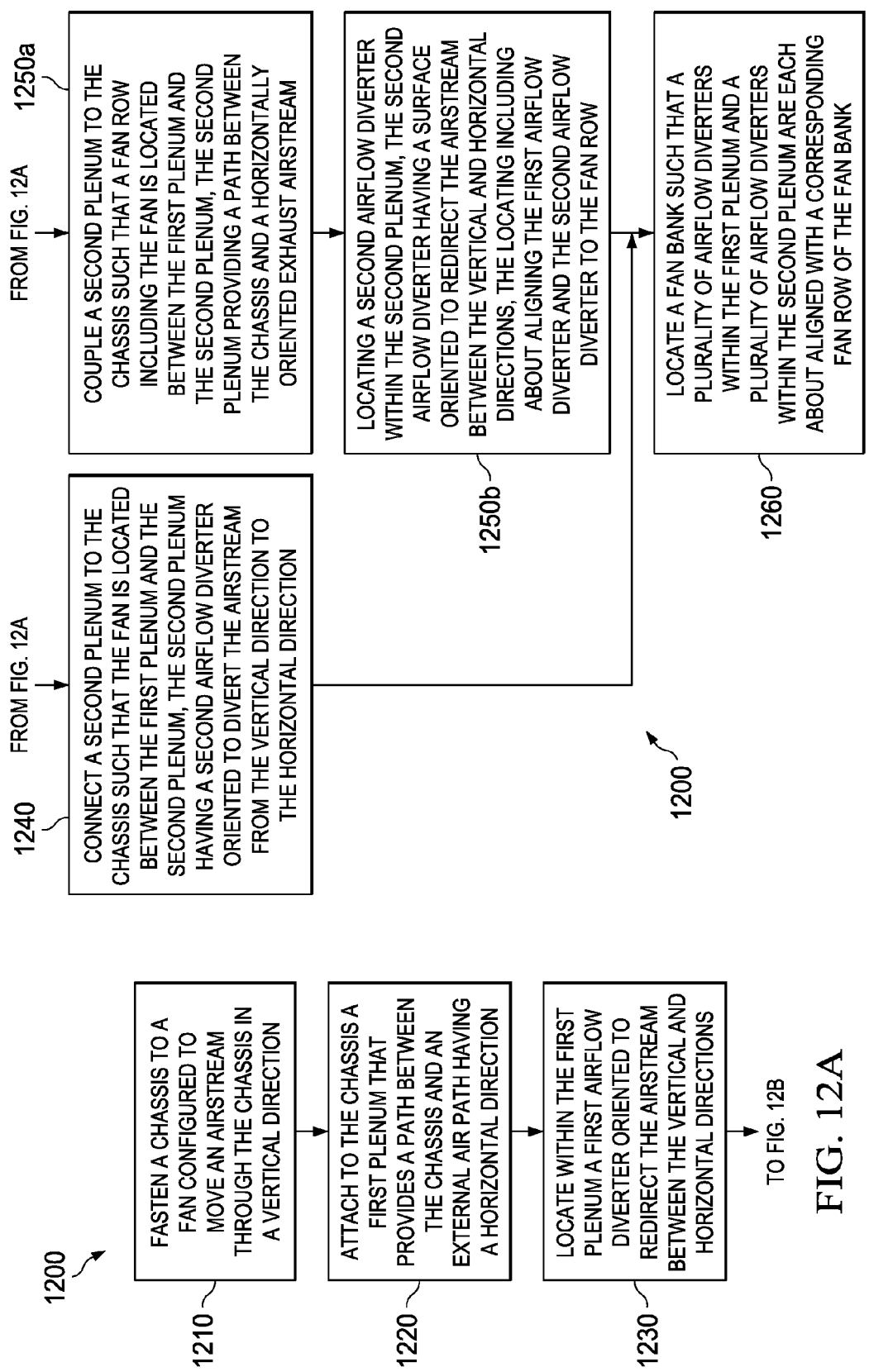

AIRFLOW CONTROL IN AN ELECTRONIC CHASSIS

TECHNICAL FIELD

This application is directed to airflow control and, more specifically, to controlling airflow within an air-cooled enclosure.

BACKGROUND

Some electronic system cabinets use fans within the cabinet to draw cooling air through an air inlet located on one end of the cabinet. The air flows over electronic components within an internal chassis, and exits the cabinet chassis from the opposite end. In addition to power consumer by the electronic components, the fans also dissipate power within the cabinet. The dissipated power adds to the heat that must be removed from the cabinet to maintain a desired operating temperature of the electronic components.

SUMMARY

One aspect provides an electronic equipment cabinet that includes a chassis and a fan coupled thereto. The fan is configured to move an airstream through the chassis. A plenum is coupled to the chassis and has a first opening in a first side located to receive the airstream, and a second opening in an adjacent second side. An airflow diverter is located within the plenum. The airflow diverter has a surface oriented to redirect the airstream between the first opening and the second opening.

In another aspect provides a method of manufacturing an electronic equipment cabinet. The method includes coupling a chassis to a fan configured to move an airstream through the chassis. A plenum is also coupled to the chassis. The plenum has a first opening in a first side located to receive the airstream and a second opening in an adjacent second side. The method includes locating an airflow diverter within the plenum. The airflow diverter has a surface oriented to redirect the airstream between the first opening and the second opening.

Another aspect provides an electronic equipment cabinet plenum. The plenum includes a plenum housing and an airflow diverter attached thereto. The plenum housing includes a first opening located in a first side, and a second opening in an adjacent second side. The airflow diverter has a surface oriented to divert an airstream between the first opening the second opening.

BRIEF DESCRIPTION

Reference is now made to the following descriptions taken in conjunction with the accompanying drawings, in which:

FIG. 2 illustrates an electronic equipment cabinet of the disclosure, including airflow diverters in an intake and an exhaust plenum;

FIG. 3 illustrates a fan array that may be used to move air through the electronic equipment cabinet of FIG. 2;

FIGS. 12A and 12B illustrate a method of manufacturing an electronic equipment cabinet, e.g. the cabinet of FIG. 2.

DETAILED DESCRIPTION

This disclosure reflects the recognition on the part of the inventors that limitations of conventional air handling within an electronic equipment cabinet may be alleviated by providing one or more air diverters to smoothly divert air from a first, e.g. vertical, path within the cabinet to a different second, e.g. horizontal, path. The smooth diversion of the air path is believed to lower the backpressure within the cabinet, thereby allowing a greater volume flow rate of air therethrough for a given output setting of fans that move the air. Increased air movement through the cabinet is expected to result in a lower operating temperature of equipment within the cabinet for a given fan setting, resulting in increased reliability and lower maintenance costs of the equipment.

Figure 1B:
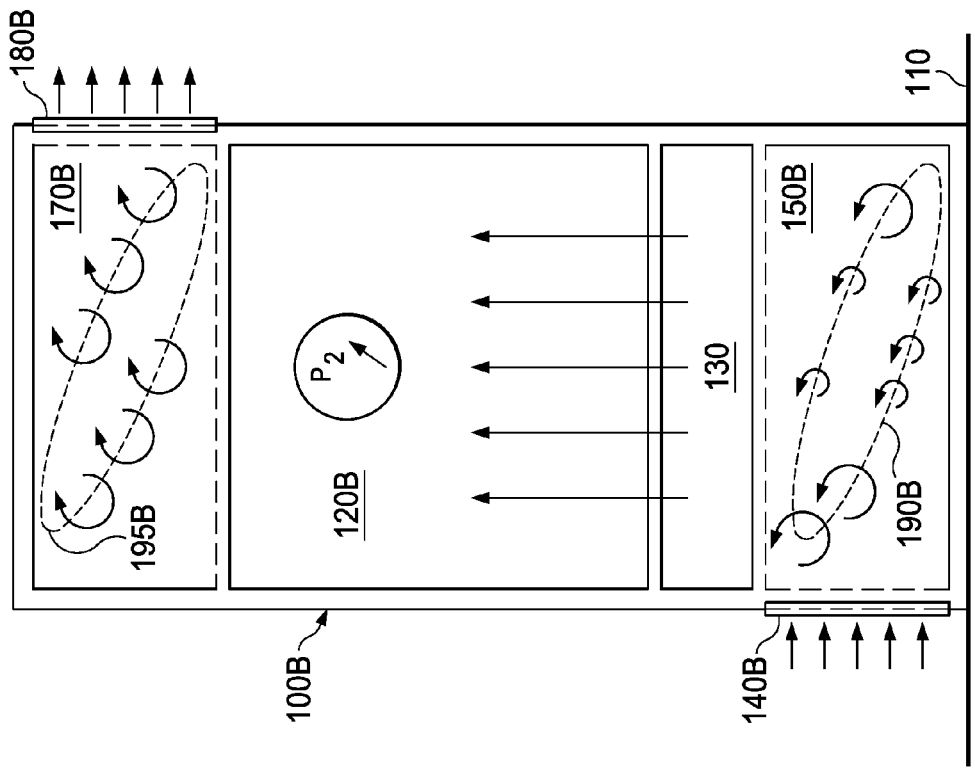
FIGS. 1A and 1B illustrate air circulation in a prior art electronic equipment cabinet.
Figure 1A:
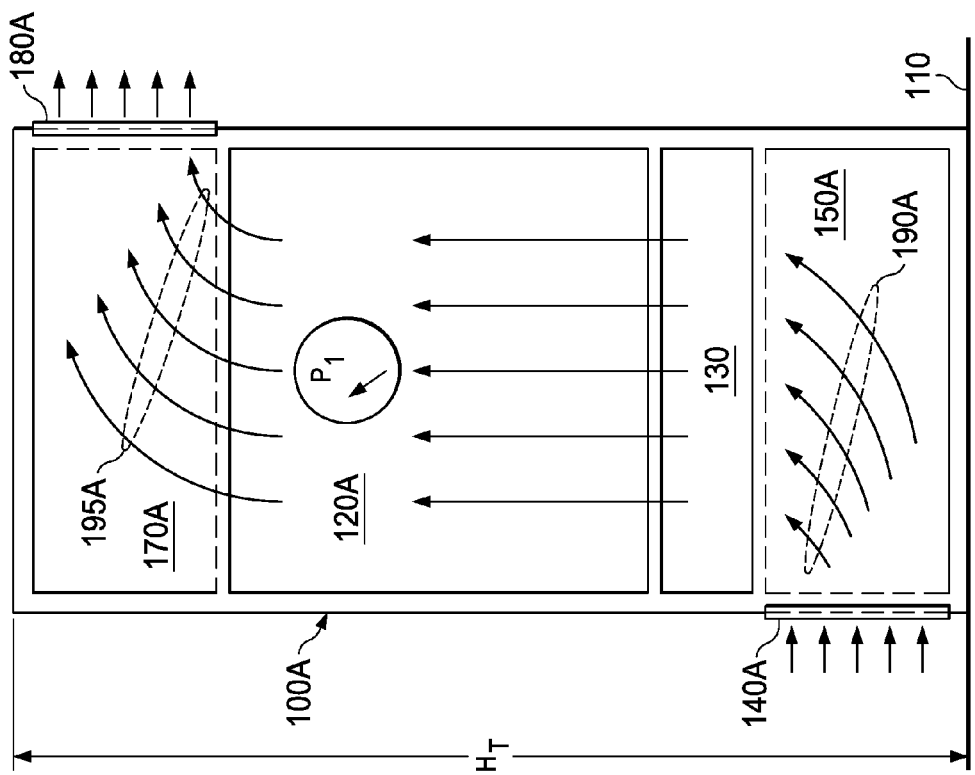

FIG. 1A illustrates a representative configuration of a prior art electronics cabinet 100A. The cabinet 100A rests on a floor 110, and has a total vertical height of $H_T$ from the floor 110 to a top of the cabinet 100A. The cabinet 100A includes an electronic equipment chassis 120A within which electronic equipment to be operated is typically located. A fan rack 130 draws an airstream into an air inlet 140A and through an intake plenum 150A. The fan rack 130 forces the received airstream vertically through the chassis 120A. The airstream enters an exhaust plenum 170A, from which the airstream exits the cabinet 100A via an air outlet 180A.

Airflow 190A within the intake plenum 150A may be relatively nonturbulent, as indicated by the smooth transition from horizontal flow to vertical flow within the intake plenum 150A. Similarly, airflow 195A within the exhaust plenum 170A may be relatively nonturbulent. The low turbulence is thought to be due in significant part to having a sufficient height of the intake plenum 150A and the exhaust plenum 170A given the width of the plenums 150A, 170A and the rate of the airflow therethrough. It is believed that when the intake plenum 150A has sufficient height, stable pressure gradients form within the intake plenum 150A that smoothly steer the airflow 190A from a horizontal direction to a vertical direction. By analogous reasoning, the airflow 195A smoothly turns from vertical flow to horizontal flow within the exhaust plenum 170A.

In many cases, it may be desirable to increase the vertical height of the chassis 120A, such as to locate more or larger electronic systems therein. However, the cabinet 100A may be located at a site, such as a data processing center, with a fixed available vertical distance, such as the height of a ceiling above the floor 110. In such cases, in may be necessary to reduce the height of one or both plenums 150A, 170A to increase the vertical height of the chassis 120A without exceeding the total vertical height $H_T$.

FIG. 1B illustrates a cabinet 100B. A chassis 120B has been lengthened in the vertical direction while an intake plenum 150B and an exhaust plenum 170B have been shortened to maintain a total height $H_T$ of the cabinet 100B. An air inlet 140B and an air outlet 180B are vertically scaled as well.

When the vertical height of the intake plenum 150B is reduced below a critical height, airflow 190B within the intake plenum 150B is expected to become turbulent. It is thought that the turbulence results from the inability to form stable pressure gradients within the intake plenum 150B for the rate of the airflow therein. Similarly, airflow 195B within the exhaust plenum 170B is expected to be turbulent below the critical height of the exhaust plenum 170B.

When excessive turbulence exists within the intake plenum 150B or the exhaust plenum 170B, the rate of airflow through the chassis 120B is expected to be lower than the case of low turbulence, e.g. the cabinet 100A. This phenomenon is thought to be due in part to a greater backpressure within the chassis 120B compared to the chassis 120A, as indicated symbolically by a pressure $P_2$ within the chassis 120B and a lower pressure $P_1$ within the chassis 120A.

The lower rate of airflow within the chassis 120B reduces the cooling capacity of the cabinet 100B as compared to the cabinet 100A. Thus, it may be necessary to limit the vertical height of the plenums 150A, 170A to ensure each is above the critical height at which turbulence occurs, resulting in an inherent limit on the maximum height of the chassis 120A. This maximum height may be insufficient in some cases to accommodate a desired electrical system within the chassis 120A. The greater backpressure of the chassis 120B may be compensated for in some cases by increasing the output of the fan bank 220. However, this solution typically increases power consumption and noise, both of which are generally undesirable. Thus, new design elements are needed to reduce turbulent airflow within the plenums 150A, 170A when the height thereof is reduced to increase the height of the chassis 120A.

FIG. 2 illustrates an electronic equipment cabinet 200 according to one embodiment of the disclosure. The cabinet 200 includes a chassis 210 and a fan bank 220. The fan bank 220 draws an incoming airstream 225 horizontally into an intake plenum 230 via an intake side 233, and vertically into the chassis 210 via a source side 236.

The intake plenum 230 includes four intake airflow diverters 250a, 250b, 250c, 250d, collectively intake airflow diverters 230. The number of airflow diverters 250 is not limited to any particular value. Each airflow diverter 250 has a surface oriented to redirect the incoming airstream 225 to a vertical chassis airstream 255.

The chassis airstream 255 enters an exhaust plenum 240 vertically via an opening in a receiving side 245. The exhaust plenum 240 includes a plenum housing 242 and four exhaust airflow diverters 260a, 260b, 260c, 260d, collectively intake airflow diverters 260. Again the number of airflow diverters 260 is not limited to any particular value. Each airflow diverter 260 has a surface oriented to redirect the chassis airstream 255 to a horizontal exhaust airstream 265. The exhaust airstream 265 exits the exhaust plenum 240 via an opening in an exhaust side 270 adjacent to the receiving side 245. In some embodiments the exhaust plenum 240 and exhaust airflow diverters 260 are oriented such that the exhaust airstream 265 flows from the exhaust plenum 240 on the same side of the cabinet 200 as the incoming airstream 225.

Herein, "vertical" and terms derived therefrom refer to a direction generally aligned with a path from the intake plenum 230 to the exhaust plenum 240, e.g. within about 30° of the ±y direction of the supplied coordinate axes. "Horizontal" refers to a direction about normal to the vertical direction, e.g. within about 60° to about 120° of normal, or within about 30° of the ±x direction of the supplied coordinate axes. These terms are used for convenience of reference, and do not imply any relationship to the horizon.

FIG. 3 illustrates the fan bank 220 in greater detail. The fan bank 220 includes a number of individual fans 310. The fan bank 220 is not limited to any particular number of fans 310. Also, the fans are illustrated as having a same diameter, but this need not be the case. In various embodiments the fans 310 are arranged in a regular array, forming fan rows 320a, 320b, 320c, 320d, collectively referred to as fan rows 320. For the purpose of this discussion and the claims, rows and columns of the array of fans 310 are considered equivalent unless otherwise stated. A reference midline 331 is about equidistant between centers of the fans 310 in the fan row 320a and centers of the fans 310 in the fan row 320b. Similarly, midlines 332, 333 are respectively located between the fan rows 320b, 320c and the fan rows 320c, 320d. The midlines 331, 332, 333 define the extent of the fan rows 320 for later reference.

Referring back to FIG. 2, in one aspect, the airflow diverters 250 may be about aligned with a corresponding fan row 320. For example, the airflow diverter 250a may be about aligned with the fan row 320a, the airflow diverter 250b may be about aligned vertically with the fan row 320b, etc. Similarly, the airflow diverters 260 may be arranged to be about aligned with a corresponding fan row 320. By "about aligned", it is meant that a horizontal projection (i.e. projected vertically onto the x-axis of the illustrated coordinate axes) of a particular airflow diverter 250, 260 overlaps a horizontal extent of the corresponding fan row 320 by at least about 50%, preferably overlapping by at least about 70% and more preferably at least about 90%.

Figure 4A:
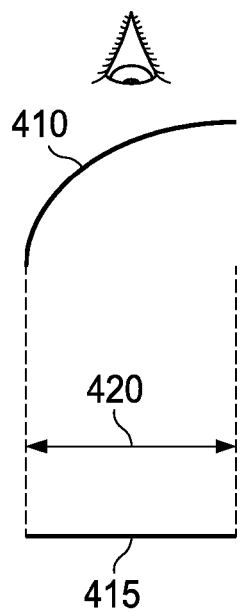
FIGS. 4A-4C illustrate horizontal projections of illustrative airflow diverters, showing alignment of the airflow diverters.
Figure 4B:
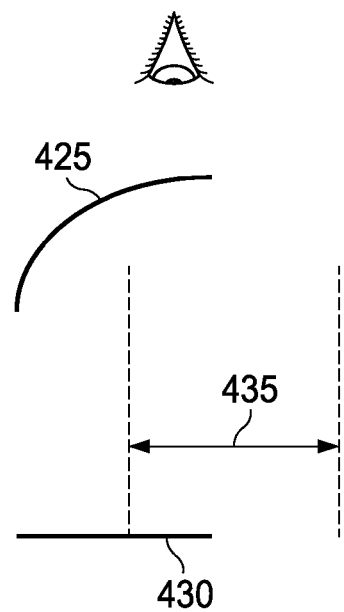
Figure 4C:
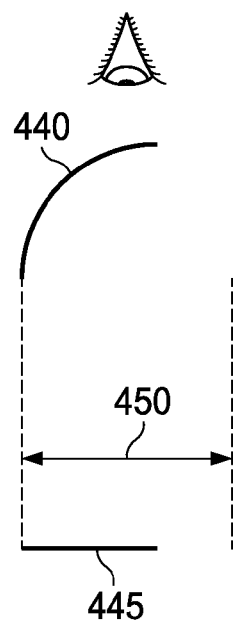

FIGS. 4A-4C illustrate examples of horizontal projections of illustrative airflow diverters. In FIG. 4A an airflow diverter 410 that when viewed from above has a horizontal projection 415. In this example, the horizontal projection 415 falls entirely within a corresponding fan row 420. Thus, the airflow diverter 410 is about aligned with the fan row 420. In FIG. 4B an airflow diverter 425 has a horizontal projection 430. The horizontal projection 430 overlaps a fan row 435 by less than about 50%. Thus the airflow diverter 425 is not about aligned with the fan row 435. In FIG. 4C, an airflow diverter 440 has a horizontal projection 445 that is shorter than, but wholly contained within a fan row 450. Thus, the overlap between the horizontal projection 445 and the fan row 450 is 100%, and the airflow diverter 440 is about aligned with the fan row 450.

In another aspect one intake airflow diverter, e.g. the airflow diverter 250a, may be about aligned to a corresponding exhaust airflow diverter, e.g. the airflow diverter 260a. Analogous to the alignment of the airflow diverter 410 and the fan row 420, the airflow diverter 250a and the airflow diverter 260a are about aligned when a horizontal projection of the airflow diverter 250a and the airflow diverter 260a overlap by at least about 50%.

Returning to FIG. 2, fan rows 320 are shown located between corresponding airflow diverters 250, 260. In a specific example, the airflow diverters 250a, 260a may be about aligned with the fan row 320a. When these components are about aligned, the flow of air between the airflow diverters 250a, 260a within the chassis 210 is expected to be substantially confined to a flow zone 280a. While various components within the chassis 210 may cooperate to guide the flow of air within the flow zone 280a, their presence is optional. Because no physical components need be present to assist in channeling air within the flow zone 280a, the flow zone 280a may be regarded as a "virtual" channel, reflecting what is expected to be quasi-laminar flow within the chassis 210. Similarly, flow zones 280b, 280c and 280d describe the flow of air between airflow diverter pairs 250b-260b, 250c-260c, and 250d-260d. The flow zones 280a, 280b, 280c, 280d may be referred to collectively as flow zones 280. In one aspect each flow zone has boundaries defined by the chassis 210 and/or an extension into the chassis 210 of one of the midlines 331, 332, 333.

In various embodiments the fan bank 220 is configured to provide about a same flow rate of air within each flow zone 280. Such balancing of air flow is expected to reduce turbulence by minimizing flow shear at zone boundaries, and/or reducing pressure variations that may lead to horizontal airflow within the chassis 210. However, the disclosure contemplates embodiments in which different fan rows 320 are configured to provide different flow rates, for example to account for different obstructions within the chassis 210.

In some embodiments, the horizontal projection associated with one or more of the airflow diverters 250, 260 extends about to each boundary of the corresponding flow zone 280. Such en embodiment is exemplified by FIG. 4A.

In various embodiments the airflow diverters 250 are formed to divert approximately equal flow rates of air from a horizontal path within the intake plenum 230 to a vertical path within the chassis 210. Similarly, in some embodiments the airflow diverters 260 are formed to divert approximately equal flow rates of air from a vertical path as received from the chassis 210 to a horizontal path within the exhaust plenum 240.

Figure 5A:
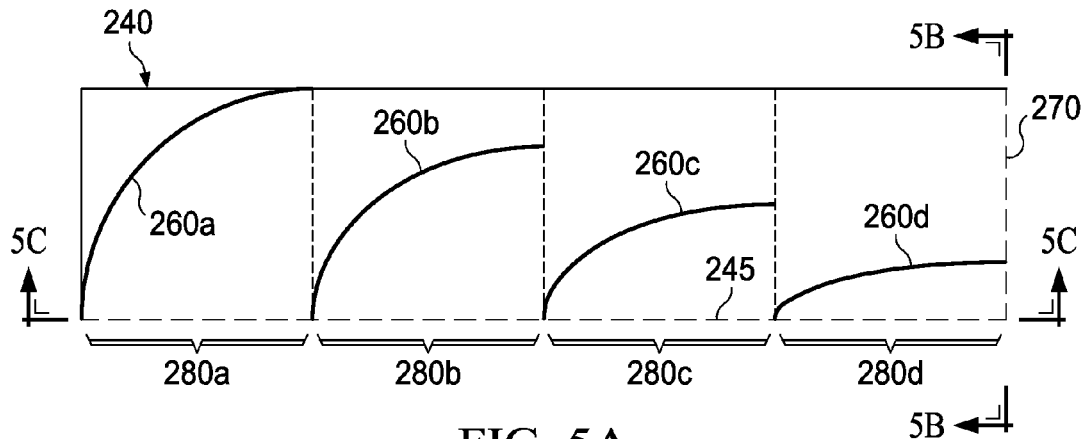
FIGS. 5A-5C illustrate aspects of a plenum of the disclosure including a plurality of elliptical airflow diverters.
Figure 5B:
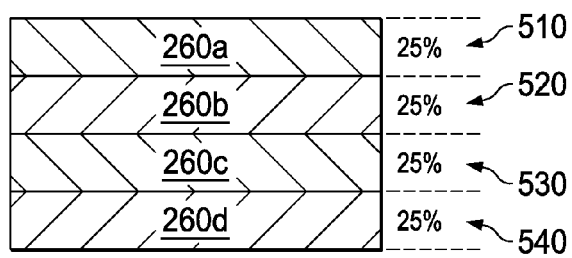
Figure 5C:
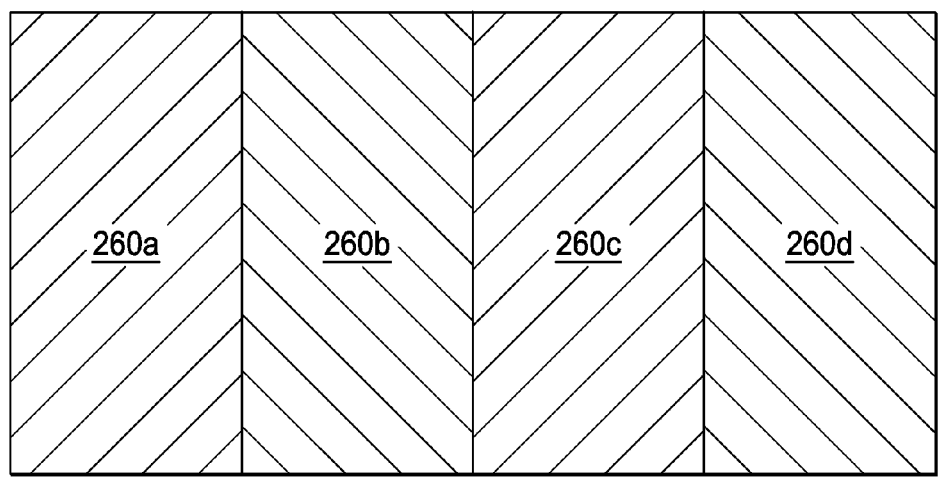

FIGS. 5A-5C illustrate this aspect with various views of the airflow diverters 260. FIG. 5A illustrates a section of the exhaust plenum 240. FIG. 5B illustrates a view of the exhaust plenum 240 from the viewpoint of the exhaust side 270. FIG. 5C illustrates a view of the exhaust plenum 240 from the receiving side 245. As illustrated by FIG. 5B, the airflow diverters 260 are arranged such that each occupies about ¼ of the vertical height of the exhaust plenum 240, dividing the exhaust side 270 into outlet regions 510, 520, 530, 540. When this feature is combined, in some embodiments, with the previously described about equal distribution of airflow between the flow zones 280, about equal volume rates of air are expected to exit the exhaust plenum 240 via each of the outlet regions 510, 520, 530, 540. This balance of airflow within the exhaust plenum 240 is expected to help maintain about equal pressure within the flow zones 280, reducing turbulence therein as previous described. The intake plenum 230 and airflow diverters 250 may be analogously configured.

The airflow diverters 260 illustrate one embodiment of an airflow diverter profile, e.g. a family of shapes of sections taken through the airflow diverters 260. The airflow diverters 260 are illustrative of an elliptical profile. In this embodiment, each of the airflow diverters 260 has a profile that may be approximately described by a portion of an elliptical curve. Such a curve may be described by the general formula $y=\sqrt{a-bx^2}$, with reference to the coordinate axes of FIG. 2.

In the illustrated embodiment, presented without limitation, each airflow diverter 260 has a vertical height about equal to an integer multiple of ¼ of the vertical height (y-direction) of the exhaust plenum 240. The illustrated principles may be extended to a lesser or greater number of airflow diverters 260. Also, each airflow diverter 260 is illustrated extending fully from one boundary of its respective associated flow zone 280a, 280b, 280c, 280d. In other embodiments, one or more airflow diverters 260 may only extend partially within its associated flow zone 280, and may or may not extend to one or both boundaries of the associated flow zone 280.

Each of the airflow diverters described herein, e.g. the airflow diverters 250, 260, may be formed from any conventional or novel material, and by any conventional or unconventional method. For example, the airflow diverters 250, 260 may be formed from sheet metal, plastic, carbon fiber or fiberglass. The airflow diverters 250, 260 may each be a single continuous sheet, or may be placed as two or more contiguous or noncontiguous portions extending in the ±z direction of the illustrated coordinate axes shown in FIG. 2.

Figure 6:
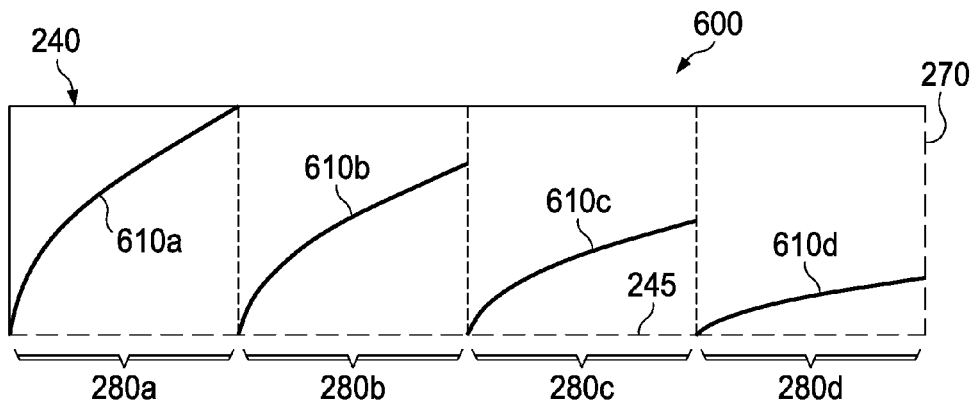
FIG. 6 illustrates a plenum of the disclosure, including parabolic airflow diverters.

FIG. 6 illustrates an embodiment designated 600 of the exhaust plenum 240. In the illustrated embodiment each of airflow diverters 610a, 610b, 610c, 610d, collectively airflow diverters 610, has a parabolic section profile. In this embodiment, each airflow diverter 610 has a profile approximately described by a portion of the equation $y=a\sqrt{x}$, with reference to the coordinate axes of FIG. 2. In the illustrated embodiment the airflow diverters 610 are arranged such that each has a vertical height about equal to an integer multiple of ¼ of the vertical height of the exhaust plenum 240, similar to the embodiment described by, e.g. FIG. 5B.

Figure 7:
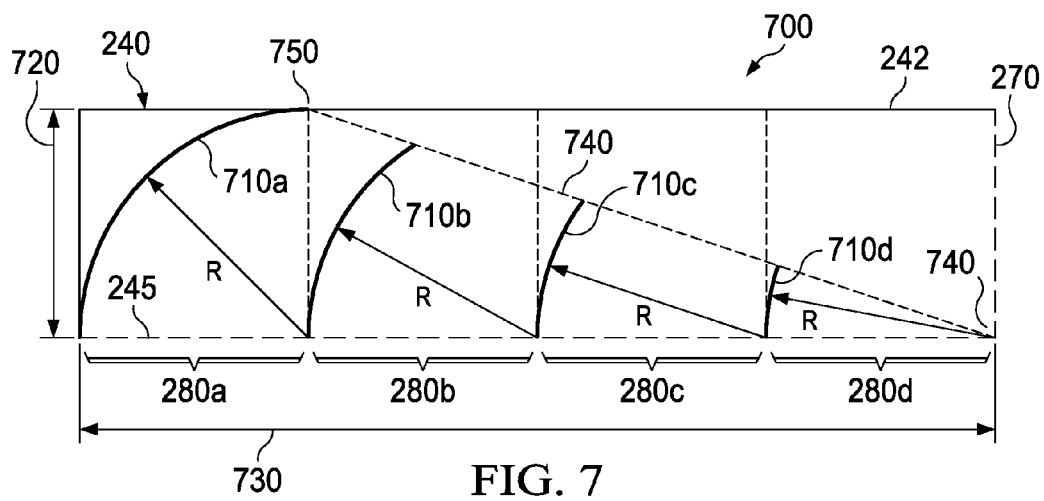
FIG. 7 illustrates a plenum of the disclosure, including truncated constant radius airflow diverters.

FIG. 7 illustrates an embodiment designated 700 of the disclosure, in which the exhaust plenum 240 includes airflow diverters 710a, 710b, 710c, 710d, collectively airflow diverters 710. The airflow diverters 710 have a profile referred to herein as a truncated constant radius. In the illustrated embodiment, the exhaust plenum 240 has a height 720 and a width 730. For the purpose of discussion the height 720 is referred to synonymously as "R". Each of the airflow diverters 710a, 710b, 710c, 710d has a radius of about R. The width 730 may therefore be about four times the height 720. In the illustrated embodiment, each flow zone 280 also has a width of about R, but embodiments of the disclosure are not limited to such a configuration. A cutoff line 740 intersects a corner 740 formed by the receiving side 245 and the exhaust side 280, and an intersection 750 of an extension of the flow zone 280a, 280b boundary and the plenum housing 242. Each of the airflow diverters 710b, 710c, 710d is truncated at the intersection of that airflow diverter and the cutoff line 740. In an embodiment, the cutoff line 740 is curved such that each of the airflow diverters 710 has a vertical height about equal to an integer multiple of ¼ of the vertical height 720 of the exhaust plenum 240, similar to the embodiment described by, e.g. FIG. 5B.

Figure 8:
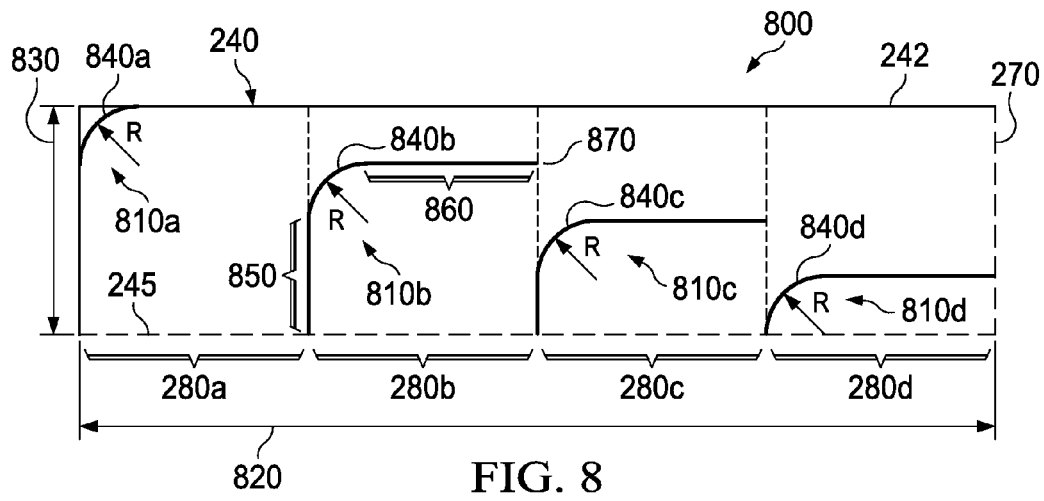
FIG. 8 illustrates a plenum of the disclosure, including constant radius airflow diverters.

FIG. 8 illustrates an alternate embodiment designated 800, in which the exhaust plenum 240 includes airflow diverters 810a, 810b, 810c, 810d, collectively airflow diverters 810. The airflow diverters 810 have a profile referred to herein as a constant radius. The exhaust plenum 240 is illustrated without limitation as having a width 820 about 4 times a height 830. Each airflow diverter 810 has a respective associated corner 840a, 840b, 840c, 840d with a same radius R. In one embodiment the radius R is about equal to ½ of the height 830.

In an embodiment one or more of the corners 840 is placed at a boundary of the associated flow zone 280 opposite the exhaust side 270. The airflow diverter 810b is illustrative of an option in which the airflow diverter 810b includes a side 850 that extends vertically from the corner 840b to the receiving side 245. The airflow diverter 810b is also illustrative of an option in which the airflow diverter 810b includes a side 860 that extends horizontally from the corner 840b in the direction of the exhaust side 270 to a boundary 870 between the flow zones 280b, 280c. In some such embodiments the side 850 and/or the side 860, or analogous sides of the airflow diverters 810a, 810c, 810d, do not extend fully to the receiving side 245 or the corresponding flow zone boundary.

Figure 9:
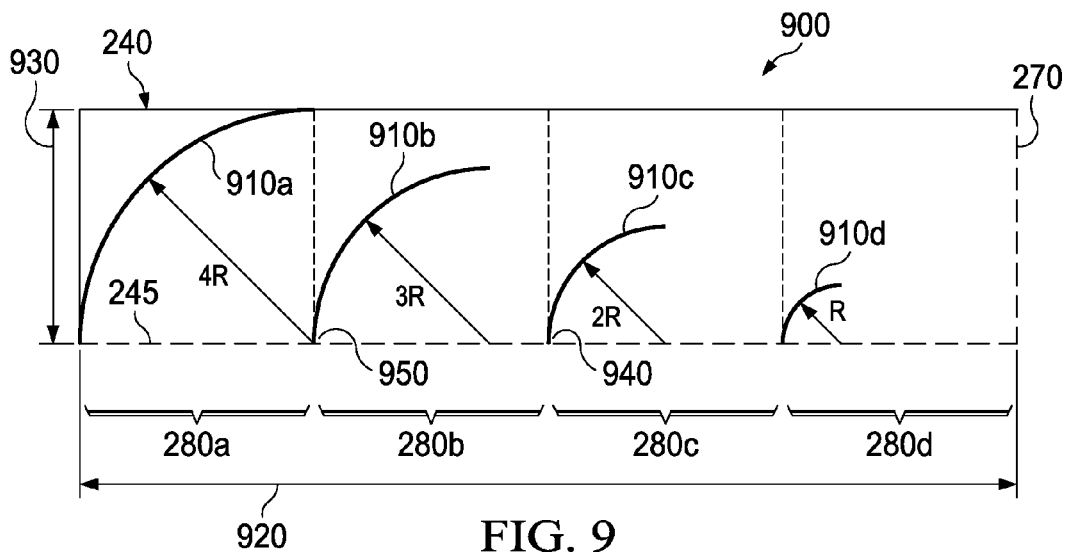
FIG. 9 illustrates a plenum of the disclosure, including scaled radius airflow diverters.

FIG. 9 illustrates an alternate embodiment designated 900, in which the exhaust plenum 240 includes airflow diverters 910a, 910b, 910c, 910d, collectively airflow diverters 910. The airflow diverters 910 have a profile referred to herein as a scaled radius. The exhaust plenum 240 has a width 920 and a height 930. Illustratively the width 920 is about multiple of a number of the airflow diverters 910 times the height 930, e.g. about four in this case.

Each of the airflow diverters 910 has a circular arc with a radius that is about an integer multiple of a ratio of the height 930 to the width 920. In the illustrated embodiment this ratio is designated for convenience as R. Thus, the airflow diverter 910d has a circular arc with a radius R, the airflow diverter 910c has a circular arc with a radius 2R, the airflow diverter 910b has a circular arc with a radius 3R, and the airflow diverter 910a has a circular arc with a radius 4R. In an embodiment one or more airflow diverters 910 is located as illustrated such that its radius origin, e.g. radius origin 940, is located on the receiving side 245 of the exhaust plenum 240. In another embodiment, one or more of the airflow diverters 910 is located as exemplified by the airflow diverter 910b, for which a most counter-clockwise end 950 thereof is located on the receiving side 245. While the airflow diverters 910 are illustrated having a section profile that spans about ¼ of a circle (90°) having the associated radius, the disclosure contemplates embodiments in which one or more of the airflow diverters 910 spans a greater or lesser portion of the associated circle. In some embodiments one or more of the airflow diverters 910 includes a horizontal or vertical side as described with respect to the sides 850, 860 (FIG. 8).

In some embodiments one airflow diverter, e.g. the airflow diverter 260a, may have a profile of one type, such as elliptical, while another of the airflow diverters, e.g. the airflow diverter 260b, has a profile of another type, such as parabolic. Furthermore while various portions of the preceding description discuss embodiments of the exhaust plenum 240, the principles described may also be used in the configuration of the intake plenum 230. Moreover, the disclosure contemplates embodiments in which either or both of the plenums 230, 240 include airflow diverters according to the various embodiments described herein.

In some embodiments the airflow diverters 260 may include one or more flat portions angled to deflect the airflow toward the exhaust side 270 (FIG. 2). In some embodiments one or more of the airflow diverters 260 may include multiple flat portions oriented to approximate a desired curved profile, e.g. the elliptical profile of the airflow diverters 260.

Figure 10:
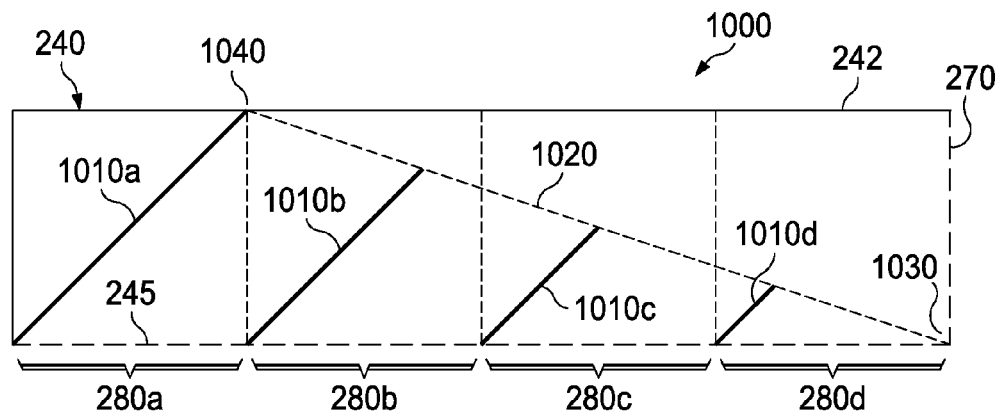
FIGS. 10 and 11 illustrate embodiments in which airflow diverters include one or more flat segments oriented to divert airflow within a plenum.

FIG. 10 illustrates an embodiment 1000 in which the exhaust plenum 240 includes airflow diverters 1010a, 1010b, 1010c, 1010d, collectively airflow diverters 1010. The airflow diverters 1010 each have a single, substantially flat segment. A cutoff line 1020 extends from an intersection 1030 of the receiving side 245 and the exhaust side 270 to an intersection 1040 of the top of the airflow diverter 1010a and the boundary between the flow zones 280a, 280b. Each of the airflow diverters 1010 extends from the intersection of its flow zone boundary and the receiving side 245 to the cutoff line 1020. In some cases, as in the illustrated embodiment, the airflow diverters 1010 are about parallel, but the disclosure contemplate embodiments in with the airflow diverters 1010 are nonparallel.

In the illustrated embodiment the airflow diverters 1010 are arranged such that each has a vertical height about equal to an integer multiple of the vertical height of the exhaust plenum 240, similar to the embodiment described by, e.g. FIG. 5B. The disclosure contemplates embodiments in which the vertical heights of the airflow diverters 1010 are not equally spaced, for instance to adjust the relative airflow volume deflected by a particular airflow diverter.

Figure 11:
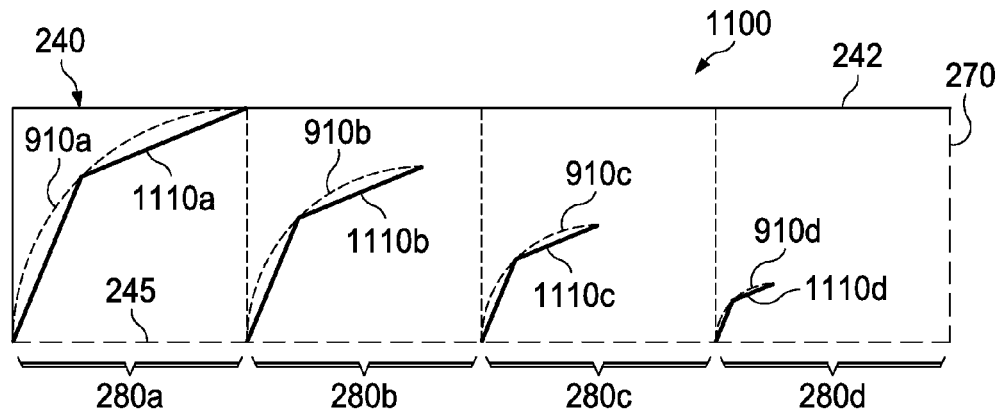

FIG. 11 illustrates an embodiment 1100 in which the exhaust plenum 240 includes airflow diverters 1110a, 1110b, 1110c, 1110d, collectively airflow diverters 1110. The airflow diverters 1110 each have two, substantially flat, segments. The segments may be formed to approximate the shape of a curved surface, and may be simpler and/or less expensive to fabricate than the curved surface that is approximated. The illustrated embodiment, for example, approximates the shape of the airflow diverters 910, outlines of which are included for reference. Any number of flat segments may be used to form the airflow diverters 1110. Moreover, the airflow diverters 1110 may approximate different curved surfaces, and may have different numbers of flat segments.

Turning to FIG. 12A, presented in an illustrative method 1200 for manufacturing an electronic equipment cabinet. The method 1200 is not exclusive of other methods contemplated by the disclosure, including but not limited to performing the steps of the method 1200 in another order than the order presented. The method 1200 is described without limitation by reference to the features of FIGS. 2, 3, 5A-5C, 6, 7, 8, and 9.

In a first step 1210, the chassis 210 is coupled to the fan bank 220. Coupling may include, e.g. directly fastening the chassis 210 to the fan bank 220 or fastening each to an internal frame of the cabinet 200 such that the fan bank 220 may move the chassis airstream 255 through the chassis 210 in a first, e.g. vertical, direction.

In a step 1220 the plenum 230 or the plenum 240 is coupled to the chassis 210. Again, coupling may be direct or via a frame member of the cabinet 200. In a step 1230 at least one airflow diverter is located within the plenum. The at least one airflow diverter has a surface oriented to redirect the chassis airstream 255 between the first direction and the second direction. In one embodiment the airflow diverter is one of the exhaust airflow diverters 260 within the exhaust plenum 240. In another embodiment the airflow diverter is one of the airflow diverters 250 within the intake plenum 230.

FIG. 12B presents optional steps of the method 1200. Optional steps may be performed, if at all, in an order different than the illustrated order. In a step 1240 the exhaust plenum 240 is coupled to the chassis 210 such that the fan bank 220 is located between the intake plenum 230 and the exhaust plenum 240. The exhaust plenum 240 has at least one exhaust airflow diverter 260 oriented to divert the airstream 255 from vertical flow to horizontal flow.

In a step 1250a the exhaust plenum 240 is coupled to the chassis such that a fan row 320 of the fan bank 220 is located between the intake plenum 230 and the exhaust plenum 240. In a step 1250b, at least one exhaust airflow diverter 260 is located within the exhaust plenum 240. The locating includes about aligning the intake airflow diverter 250 and the exhaust airflow diverter 260 to the fan row.

In a step 1260 the fan bank 220 is located such that each of the intake airflow diverters 250 and each of the exhaust airflow diverters 260 is about aligned with a corresponding one of the fan rows 320.

Optionally, the intake plenum 230 may include a plurality of airflow diverters, e.g. the intake airflow diverters 250. Optionally, the exhaust plenum 240 may include a plurality of airflow diverters, e.g. the exhaust airflow diverters 260.

Those skilled in the art to which this application relates will appreciate that other and further additions, deletions, substitutions and modifications may be made to the described embodiments.

What is claimed is:

1. An electronic equipment cabinet comprising:
   a chassis;
   an intake plenum located within said chassis and having an intake opening to receive an airstream therethrough;
   an exhaust plenum located on an opposite end of said chassis from said intake plenum and having an exhaust opening to exhaust said airstream from said chassis;
   at least first and second fans coupled to said chassis and located between said intake plenum and said exhaust plenum and oriented to move said airstream through said chassis;
   first and second pairs of airflow diverters, wherein said first pair of airflow diverters has a first diverter located within said intake plenum and a second diverter located in said exhaust plenum and said second pair of airflow diverters has a third diverter located within said intake plenum and a fourth diverter located within said exhaust plenum, said first and third air flow diverters having a surface oriented to redirect said airstream from said intake plenum to said exhaust plenum and second and fourth airflow diverters having a surface oriented to redirect said airstream out of said chassis, said first pair of air flow diverters is about aligned with said first fan and second pair of airflow diverters being about aligned with said second fan: and
   an open flow zone located between and fluidly connecting said intake plenum and said exhaust and said first and second pairs of airflow diverters, said first and second pairs of airflow diverters oriented to create separate, laminar flow zones within said open flow zone.

2. The electronic equipment cabinet as recited in claim 1, wherein said first and second pairs of airflow diverters have an elliptical curvature.

3. The electronic equipment cabinet as recited in claim 1, wherein said first and second pairs of airflow diverters are two of a plurality of pairs of airflow diverters, said first, second and third pairs of the flow diverters oriented to redirect said airstream through said open flow zone and from said intake plenum to said exhaust plenum and out of said chassis.

4. The electronic equipment cabinet as recited in claim 3, wherein each of said plurality of said pairs of airflow diverters has a same radius of curvature.

5. The electronic equipment cabinet as recited in claim 3, wherein said plurality of said pairs of airflow diverters further includes a third pair of airflow diverters having respective first, second and third radii of curvature, said second radius of curvature being a multiple of said first radius of curvature, and said third radius of curvature being said multiple of said second radius of curvature.

6. The electronic equipment cabinet as recited in claim 3, wherein each of said plurality of said pairs of airflow diverters has a same radius of curvature about equal to a height of said intake and exhaust plenums.

7. The electronic equipment cabinet as recited in claim 1, wherein said first and third airflow diverters are oriented to divert said airstream from a horizontal direction to a vertical direction with said chassis; and
   said second and fourth airflow diverters are oriented to divert said airstream from said vertical direction to said horizontal direction.

8. The electronic equipment cabinet as recited in claim 1, wherein said first and second fans are members of a row of fans, and said first and second pairs of airflow diverters are about aligned with said row of fans.

9. A method of manufacturing an electronics cabinet, comprising:
   coupling at least first and second fans within a chassis, said first and second fans oriented to move an airstream through an open flow zone of said chassis and between an intake plenum and an exhaust plenum located with said chassis and that are fluidly coupled by said open flow zone, said intake plenum having an intake opening to receive an airstream therethrough and said exhaust plenum having and exhaust opening to exhaust said airstream from said chassis; and
   locating first and second pairs of airflow diverters within said chassis, wherein said first pair of airflow diverter has a first diverter located within said intake plenum and a second diverter located in said exhaust plenum and said second pair of airflow diverters has a third diverter located within said intake plenum and a fourth diverter located within said exhaust plenum, said first and third air flow diverters having a surface oriented to redirect said airstream from said intake plenum through said open zone and to said exhaust plenum and said second and fourth airflow diverters having a surface oriented to redirect said airstream out of said chassis, said first pair of air flow diverters is about aligned with said first fan and said second pair of airflow diverters is about aligned with said second fan, said first and second pairs of airflow diverters oriented to create separate, laminar flow zones within said open flow zone.

10. The method as recited in claim 9, wherein said first and second pairs of airflow diverters have an elliptical curvature.

11. The method as recited in claim 9, wherein said first and second pairs of airflow diverters are two of a plurality of pairs of airflow diverters oriented to redirect said airstream through said open flow zone and from said intake plenum to said exhaust plenum and out of said chassis.

12. The method as recited in claim 11, wherein each of said plurality of said pairs of airflow diverters has a same radius of curvature.

13. The method as recited in claim 11, wherein said plurality of said pairs of airflow diverters further includes a third pair of airflow diverters, said first, second and third pairs of airflow diverters having respective first, second and third radii of curvature, said second radius of curvature being a multiple of said first radius of curvature, and said third radius of curvature being said multiple of said second radius of curvature.

14. The method as recited in claim 11, wherein each of said plurality of said pairs of airflow diverters has a same radius of curvature about equal to a height of said intake and exhaust plenums.

15. The method as recited in claim 9, wherein said first and third airflow diverters are oriented to divert said airstream from a horizontal direction to a vertical direction with said chassis; and
   said second and fourth airflow diverters are oriented to divert said airstream from said vertical direction to said horizontal direction.

16. The method as recited in claim 9, wherein said first and second fans are members of a row of fans, and said first and second pairs of airflow diverters are about aligned with said row of fans.

* * * * *